(12) United States Patent
Aoyagi et al.

(10) Patent No.: US 8,945,436 B2
(45) Date of Patent: Feb. 3, 2015

(54) CONDUCTIVE PASTE AND ELECTRONIC PART EQUIPPED WITH ELECTRODE WIRING FORMED FROM SAME

(75) Inventors: Takuya Aoyagi, HItachi (JP); Takashi Naito, Funabashi (JP); Hiroki Yamamoto, Hitachi (JP); Takahiko Kato, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 537 days.

(21) Appl. No.: 13/203,876

(22) PCT Filed: Mar. 27, 2009

(86) PCT No.: PCT/JP2009/001403
§ 371 (c)(1),
(2), (4) Date: Aug. 30, 2011

(87) PCT Pub. No.: WO2010/109541
PCT Pub. Date: Sep. 30, 2010

(65) Prior Publication Data
US 2011/0315937 A1    Dec. 29, 2011

(51) Int. Cl.
```
H01B 1/22       (2006.01)
H01L 31/0224    (2006.01)
H01B 1/16       (2006.01)
H01J 11/22      (2012.01)
H01L 31/0352    (2006.01)
H01L 31/068     (2012.01)
```
(52) U.S. Cl.
CPC .......... H01L 31/022425 (2013.01); H01B 1/16 (2013.01); H01J 11/22 (2013.01); H01L 31/03529 (2013.01); H01L 31/068 (2013.01); H01L 31/0682 (2013.01); H01J 2211/225 (2013.01); Y02E 10/547 (2013.01)
USPC .......................... 252/520.4; 252/514; 252/512

(58) Field of Classification Search
CPC .............. H01B 1/20; H01B 1/02; H01B 1/22; H01B 1/023; H01B 1/026; Y02E 10/54
USPC ........................................ 252/520.4, 514, 512
See application file for complete search history.

(56) References Cited

U.S. PATENT DOCUMENTS

| | | | | |
|---|---|---|---|---|
| 8,367,573 | B2 * | 2/2013 | Naito et al. | 501/46 |
| 8,470,723 | B2 * | 6/2013 | Naito et al. | 501/24 |
| 2005/0089679 | A1 | 4/2005 | Ittel et al. | |
| 2007/0286973 | A1 * | 12/2007 | Sawai et al. | 428/34.4 |
| 2009/0220738 | A1 | 9/2009 | Oka et al. | |
| 2010/0151323 | A1 * | 6/2010 | Naito et al. | 429/219 |
| 2011/0001094 | A1 * | 1/2011 | Hashiba et al. | 252/506 |
| 2011/0084238 | A1 * | 4/2011 | Hibst et al. | 252/506 |
| 2012/0067415 | A1 * | 3/2012 | Tachizono et al. | 136/256 |
| 2013/0015410 | A1 * | 1/2013 | Hashiba et al. | 252/506 |

FOREIGN PATENT DOCUMENTS

| | | | |
|---|---|---|---|
| EP | 1 887 583 A1 | | 2/2008 |
| JP | 1-95170 | | 4/1989 |
| JP | 8-138969 | | 5/1996 |
| JP | 08-138969 A | * | 5/1996 |
| JP | 2000-36220 | | 2/2000 |
| JP | 2002-313664 | | 10/2002 |
| JP | 2007-70127 | | 3/2007 |
| JP | 2007-294633 | | 11/2007 |
| JP | 2007320822 A | * | 12/2007 |
| JP | 2008-159917 | | 7/2008 |
| JP | 2008-251324 | | 10/2008 |
| JP | 2009-1604 | | 1/2009 |
| WO | WO 2006/129487 A1 | | 12/2006 |

OTHER PUBLICATIONS

Restriction of Harzardous Substances Directive, Wikipedia, pp. 1-16, Feb. 13, 2014.*
CRC Handbok of Chemistry and Physics, CRC Press, Inc., 77th edition, 1996, 1-15.*
German office action dated Jul. 24, 2012 with English translation.

* cited by examiner

*Primary Examiner* — Douglas McGinty
(74) *Attorney, Agent, or Firm* — Antonelli, Terry, Stout & Kraus, LLP.

(57) ABSTRACT

Provided is a conductive paste which contains an inexpensive metal, such as copper or aluminum, as an electrode wiring material and has oxidation resistance that enables the paste to withstand a high-temperature process performed in an oxidizing atmosphere and an electronic part equipped with electrode wiring formed from the paste. The electronic part in accordance with the present invention is equipped with electrode wiring that comprises a conductive glass phase containing transition metals and phosphorus, metal particles, and none of the substances prohibited by the RoHS directive. The electronic part is characterized in that each of the transition metals contained in the conductive glass phase is present in the state of having a plurality of oxidation numbers and that the proportion of the atoms which have the largest oxidation number for each transition metal satisfies a given relationship.

23 Claims, 7 Drawing Sheets

CONDUCTIVE PASTE AND ELECTRONIC PART EQUIPPED WITH ELECTRODE WIRING FORMED FROM SAME

TECHNICAL FIELD OF THE INVENTION

The present invention relates to conductive pastes useful in forming electrode wiring and, in particular, to a conductive paste which prevents oxidative degradation of electrode wiring even when fired in an oxidizing atmosphere and an electronic part equipped with electrode wirings formed therefrom.

DESCRIPTION OF BACKGROUND ART

An electronic part such as a solar panel, a plasma display panel (PDP), and a liquid crystal display (LCD) panel has electrode wirings formed on the substantially entire surface thereof. Such electrode wiring is formed by applying a conductive paste which contains metal particles, a glass powder, a resin binder, and a solvent to a glass substrate, a silicon substrate, or the like, and thereafter firing the applied substrate utilizing an electric furnace, a laser, or the like. At this point, the applied substrate is heated to a temperature above the softening point of the glass powder contained in the conductive paste so that the glass powder softens and flows to form tight electrode wirings and securely adheres to the substrate of glass, silicon, or the like.

For example, the manufacturing process of electronic parts such as solar panels and PDPs involves firing at high temperatures ranging from about 600° C. to about 800° C. in an oxidizing atmosphere such as the air. As a result, silver (Ag) electrode wiring, which does not oxidize even in this firing process, is often employed as electrode wirings. Being highly reliable with its excellent electrical properties, silver has the advantage of being readily formed into electrode wirings. However, there are problems associated with the use of silver: high material costs, susceptibility to migration, etc.

On the other hand, a heat treatment process in the manufacturing process of electronic parts such as large-scale integrated circuits (LSI) and LCD panels does not involve exposure to a strong oxidizing atmosphere. Therefore, pure copper (Cu) and pure aluminum (Al) are often used as an electrode wiring material for such parts. Copper and aluminum also have excellent electrical properties and the advantage of being overwhelmingly inexpensive compared to silver. Unfortunately, however, since they easily oxidize in a heat treatment in an oxidizing atmosphere, there have been limitations to their use as an electrode wiring material.

In view of the aforementioned, it has been suggested to perform some kind of anti-oxidation treatment to permit firing of a conductive paste containing copper or aluminum as a conductive component in an oxidizing atmosphere. For example, Patent Literature 1 (Japanese Patent Laid-open No. 2000-36220) discloses a conductive paste containing a copper powder and a glass frit, in which the glass frit consists primarily of boron oxide ($B_2O_3$), bismuth oxide ($Bi_2O_3$), zinc oxide (ZnO), and an alkali metal salt or alkaline-earth metal salt of a phosphoric acid.

Patent Literature 2 (Japanese Patent Laid-open No. 2008-159917) discloses a conductive paste for photoelectric conversion elements. The conductive paste contains a metal powder consisting primarily of Al and a glass powder having a glass transition point in the range of between 280° C. and 430° C. Also, in the conductive paste of Patent Literature 2, PbO (lead oxide) represents greater than or equal to 70% by weight, based on the total weight of the glass powder, and the glass powder contains at least one oxide selected from the group consisting of $SiO_2$ (silicon oxide), $B_2O_3$, $B_2O_3$, and ZnO.

Patent Literature 3 (Japanese Patent Laid-open No. 2007-070127), with the aim of providing a Pb-free conductive bonding material for securing a spacer in a display panel of an image display device, discloses a conductive member which contains a phosphorus-based glass containing at least one element selected from the group consisting of vanadium (V), niobium (Nb), tungsten (W), molybdenum (Mo), and iron (Fe) and metal particles of silver or copper, in which the at least one element has two valences. Also, in the conductive member of Patent Literature 3, the metal particles of silver or copper represent not less than 10% and not more than 50% by volume.

Patent Literature 1: Japanese Patent Laid-open No. 2000-36220

Patent Literature 2: Japanese Patent Laid-open No. 2008-159917

Patent Literature 3: Japanese Patent Laid-open No. 2007-070127

DISCLOSURE OF THE INVENTION

Problems to be Solved by the Invention

The conductive paste described in Patent Literature 1 is supposed to prevent oxidation of the copper powder when fired not only in a neutral atmosphere but also in a weak oxidizing atmosphere. However, it is considered difficult for the conductive paste of Patent Literature 1 to prevent oxidation of the copper powder in a strong oxidizing atmosphere as in the case of high-temperature firing in the air.

Meanwhile, in the electrical and electronic device industry, the global trend toward green procurement and green design has been intensifying in recent years, and there is a need for safer materials. In Europe, for example, a directive concerning the restriction of the use of specified hazardous substances in electronic and electrical devices (the RoHS directive) is in effect. Unfortunately, the conductive paste described in Patent Literature 2 cannot meet the RoHS directive, since its glass powder contains PbO.

The conductive member described in Patent Literature 3, which is lead (Pb)-free, can meet the RoHS directive, and since it contains a relatively small amount of metal particles, it is considered to exhibit good electrical conduction properties while maintaining the wettability of the glass. However, no particular care is taken concerning the conduction mechanism due to the oxidation number (oxidation state) of a transition metal and the anticorrosion mechanism for the metal particles in the glass powder, and the metal particles in the conductive member can be oxidized.

In view of the background art described above, further measures are needed to permit the use of copper particles and aluminum particles, as equivalent substitutes for conventionally used silver particles, as an electrode wiring material for electronic parts which are subjected to high-temperature firing (e.g. at about 600° C. to 800° C.) in an oxidizing atmosphere such as the air in the manufacturing process. Accordingly, it is an objective of the present invention to provide a conductive paste having oxidation resistance that enables the paste to withstand a high-temperature process performed in an oxidizing atmosphere and to provide an electronic part equipped with electrode wirings formed from the conductive paste.

Means for Solving the Problems (I) In order to achieve the above-mentioned objective, according to one aspect of the present invention, there is provided an electronic part equipped with electrode wiring, the electrode wiring comprising: a conductive glass phase containing transition metals and phosphorus; metal particles; and none of the substances prohibited by the RoHS directive, in which: each of the transition metals contained in the conductive glass phase is present in the state of having a plurality of oxidation numbers; and the proportion of the atoms which have the largest oxidation number for each of the transition metals satisfies a relationship expressed by the following equation (1):

$$\frac{\{V^{5+}\} + \{W^{6+}\} + \{Mo^{6+}\} + \{Fe^{3+}\} + \{Mn^{4+}\}}{\{V\} + \{W\} + \{Mo\} + \{Fe\} + \{Mn\}} > 0.5, \qquad \text{Eq. (1)}$$

where braces { } indicate the measured concentration of the enclosed ion or atom (unit: mol/L).

(II) In order to achieve the above-mentioned objective, according to another aspect of the present invention, there is provided an electronic part equipped with electrode wiring, the electrode wiring comprising: a conductive glass phase; metal particles; and none of the substances prohibited by the RoHS directive, in which the conductive glass phase consists primarily of vanadium and phosphorus, and the mass fractions of the constituents in terms of oxides satisfy a relationship expressed by the following equation (2):

$$2 \times \frac{[V_2O_5]}{[P_2O_5]} \geq ([Sb_2O_3] + [Fe_2O_3] + [MnO_2] + [Bi_2O_3]) \geq 0, \qquad \text{Eq. (2)}$$

where brackets [ ] indicate the mass fraction of the enclosed oxide (unit: mass %).

Herein, the substances prohibited by the RoHS directive are defined as the substances prohibited by the hazardous substance regulations enforced by the EU (European Union) on Jul. 1, 2006. Also, the above-mentioned expression "comprising none of the substances prohibited by the RoHS directive" means that comprising the substances prohibited by the RoHS directive in an amount of less than or equal to a designated value is acceptable.

In addition, to achieve the above-mentioned objective, the following modifications and changes can be made to the above aspects (I) and (II) of the present invention:

(i) The metal particles are of silver, copper, aluminum, or an alloy based on one of these metals;

(ii) The metal particles represent not less than 90.0% and not more than 99.7% by volume, and the conductive glass phase represents not less than 0.3% and not more than 10.0% by volume, based on the total volume of the electrode wiring;

(iii) The metal particles consist of a first group of particles about 95% by volume of which having a particle size in the range of not less than 0.5 μm and less than 1.5 μm and a second group of particles about 95% by volume of which having a particle size in the range of not less than 1.5 μm and less than 8 μm;

(iv) The metal particles include spherical particles and plate-like particles;

(v) The metal particles in the electrode wiring have been sintered together;

(vi) The electronic part is a solar panel, a plasma display panel, or a ceramic mounting substrate; and (vii) The electronic part is a solar panel, and the glass transition point of the glass phase is not lower than 400° C. and not higher than 520° C.

(III) Also, in order to achieve the above-mentioned objective, according to another aspect of the present invention, there is provided a conductive paste comprising: conductive glass particles containing transition metals and phosphorus; metal particles; a binder resin; a solvent; and none of the substances prohibited by the RoHS directive, in which: each of the transition metals contained in the conductive glass particles is present in the state of having a plurality of oxidation numbers; and the proportion of the atoms which have the largest oxidation number for each of the transition metals satisfies a relationship expressed by the following equation (1):

$$\frac{\{V^{5+}\} + \{W^{6+}\} + \{Mo^{6+}\} + \{Fe^{3+}\} + \{Mn^{4+}\}}{\{V\} + \{W\} + \{Mo\} + \{Fe\} + \{Mn\}} > 0.5, \qquad \text{Eq. (1)}$$

where braces { } indicate the measured concentration of the enclosed ion or atom (unit: mol/L).

(IV) Moreover, in order to achieve the above-mentioned objective, according to another aspect of the present invention, there is provided a conductive paste comprising: conductive glass particles; metal particles; a binder resin; a solvent; and none of the substances prohibited by the RoHS directive, in which: the conductive glass particles consist primarily of vanadium and phosphorus; and the mass fractions of the constituents in terms of oxides satisfy a relationship expressed by the following equation (2):

$$2 \times \frac{[V_2O_5]}{[P_2O_5]} \geq ([Sb_2O_3] + [Fe_2O_3] + [MnO_2] + [Bi_2O_3]) \geq 0, \qquad \text{Eq. (2)}$$

where brackets [ ] indicate the mass fraction of the enclosed oxide (unit: mass %).

In addition, to achieve the above-mentioned objective, the following modifications and changes can be made to the above aspects (III) and (IV) of the present invention:

(viii) The conductive glass particles contain barium;

(ix) The metal particles are of silver, copper, aluminum, or an alloy based on one of these metals;

(x) The metal particles consist of a first group of particles about 95% by volume of which having a particle size in the range of not less than 0.5 μm and less than 1.5 μm and a second group of particles about 95% by volume of which having a particle size in the range of not less than 1.5 μm and less than 8 μm; and (xi) The metal particles include spherical particles and plate-like particles.

Advantages of the Invention

According to the present invention, in an electronic part equipped with electrode wirings (e.g., a solar panel, a plasma display panel (PDP), a ceramic mounting substrate, a large-scale integrated circuit (LSI), etc.), oxidation resistance can be imparted to the electrode wiring. As a result, the electrode wiring is not oxidized when subjected to high-temperature firing (e.g., at about 600° C. to 800° C.) in an oxidizing atmosphere such as the air in the process of manufacturing the electronic part, which makes it possible to reduce the electrical resistance of the electrode wiring. This also permits utilizing inexpensive metal particles, such as copper particles and aluminum particles, as an electrode wiring material and thus forming electrode wiring at low cost (i.e., providing low-cost electronic parts).

LEGEND

Figure 1:
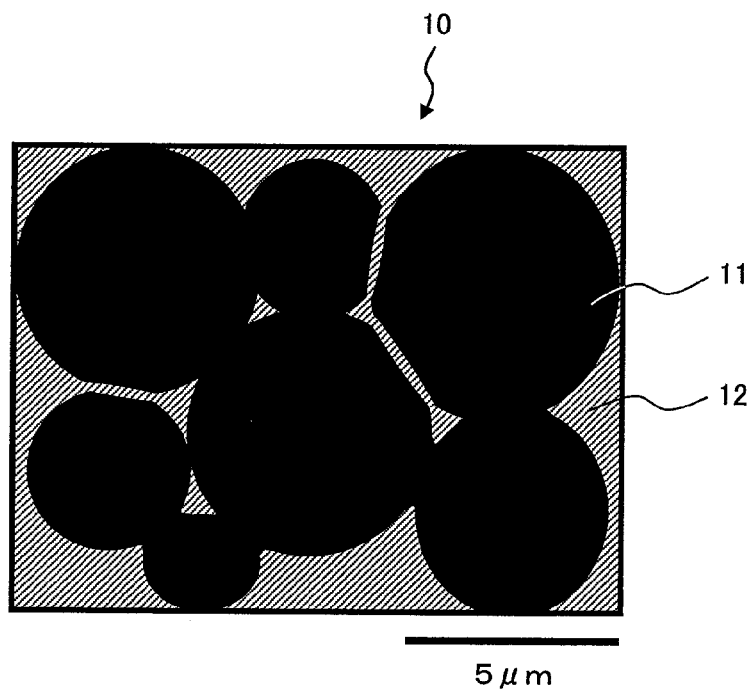
FIG. 1 is a schematic illustration showing a typical SEM observation image of a microstructure of formed electrode wiring.

10 ... ELECTRODE WIRING;
11 ... METAL PARTICLES;
12 ... CONDUCTIVE GLASS PHASE;
60 ... SOLAR PANEL;
61 ... SEMICONDUCTOR SUBSTRATE;
62 ... DIFFUSION LAYER;
63 ... ANTIREFLECTION LAYER;
64 ... LIGHT-RECEIVING SURFACE ELECTRODE WIRING;
64' ... ELECTRODE WIRING;
65 ... COLLECTING ELECTRODE WIRING;
66 ... OUTPUT ELECTRODE WIRING;
67 ... ELECTRODE COMPONENT DIFFUSION LAYER;
68 ... PASSIVATION FILM;
70 ... BACK ELECTRODE TYPE SOLAR PANEL;
800 ... PLASMA DISPLAY PANEL;
801 ... FRONT PLATE;
802 ... BACK PLATE;
803 ... PARTITION WALL;
804 ... SEALING MATERIAL;
805 ... CELL;
806 ... RED PHOSPHOR;
807 ... GREEN PHOSPHOR;
808 ... BLUE PHOSPHOR;
809 ... DISPLAY ELECTRODE;
810 ... ADDRESS ELECTRODE;
811 ... ULTRAVIOLET LIGHT;
812, 813 ... DIELECTRIC LAYER;
814 ... PROTECTION LAYER;
815 ... BLACK MATRIX;
90 ... MULTILAYER WIRING BOARD;
91 ... WIRING CONDUCTIVE PASTE;
92 ... GREEN SHEET; and
93 ... THROUGH HOLE.

BEST MODE FOR CARRYING OUT THE INVENTION

Preferred embodiments of the present invention will be described hereinafter with reference to specific examples. It should be noted that the present invention is not limited to the examples described herein, and appropriate combinations may be implemented.

Embodiment 1

Fabrication of Conductive Glass Particles

Conductive glass particles (Glass Sample No. 1-38) having the composition shown in Table 1 below were fabricated. The compositions of Table 1 are shown in mass fraction of each constituent in terms of oxides. Each of these conductive glass samples did not contain lead (Pb), which is a substance prohibited by the RoHS directive, and had a composition based on vanadium (V), phosphorus (P), and barium (Ba). As starting materials, vanadium pentoxide ($V_2O_5$), phosphorus pentoxide ($P_2O_5$), barium carbonate ($BaCO_3$), lithium carbonate ($Li_2CO_3$), sodium carbonate ($Na_2CO_3$), potassium carbonate ($K_2CO_3$), antimony trioxide ($Sb_2O_3$), manganese dioxide ($MnO_2$), diiron trioxide ($Fe_2O_3$), bismuth trioxide ($Bi_2O_3$), zinc oxide (ZnO), tungsten trioxide ($WO_3$), tellurium dioxide ($TeO_2$), copper oxide (CuO), molybdenum trioxide ($MoO_3$), and boron oxide ($B_2O_3$) were used. Also, in the case of using barium phosphate ($Ba(PO_3)_2$) as a raw material for barium, the amount of $P_2O_5$ is adjusted. In addition, as a raw material for antimony, antimony tetroxide ($Sb_2O_4$) may be used, and as raw materials for manganese and iron, manganese oxide (MnO), iron oxide (FeO), and triiron tetraoxide ($Fe_3O_4$) may be used.

Each of the samples of conductive glass particles was fabricated in the following procedures. The starting materials were compounded and mixed such that the resultant powder mix had a composition shown in Table 1. The powder mix was put into a platinum crucible and heated to 1000° C. to 1100° C. and held at the temperature for two hours utilizing an electric furnace. During the holding period, the molten powder mix was stirred to obtain homogeneous glass. Next, the platinum crucible was taken out of the electric furnace and the mixture was poured onto a stainless plate that had been heated to 200° C. to 300° C. in advance. Then, the mixture was pulverized utilizing a stamp mill to form conductive glass particles. In addition, commercially available Pb-based glass and commercially available Bi-based glass were prepared separately as Comparative Example 1 and Comparative Example 2, respectively.

TABLE 1

| Glass Sample No. | Glass Composition (mass %) | | | | | | | | | | |
|---|---|---|---|---|---|---|---|---|---|---|---|
| | $V_2O_5$ | $P_2O_5$ | $Sb_2O_3$ | $MnO_2$ | $Fe_2O_3$ | $Bi_2O_3$ | $Li_2O$ | $Na_2O$ | $K_2O$ | BaO | ZnO |
| 1 | 80 | 10 | 10 | | | | | | | | |
| 2 | 65 | 25 | 5 | | | | | | | | |
| 3 | 60 | 21 | 15 | | | | | | 4 | | |
| 4 | 58 | 20 | 17 | | | | | | | 5 | |
| 5 | 55 | 25 | 10 | | | | | | | 10 | |
| 6 | 55 | 22 | 4 | | | | | | | 19 | |
| 7 | 54 | 20 | 21 | | | | | | | 5 | |
| 8 | 54 | 20 | 5 | | | | | | | 21 | |
| 9 | 54 | 20 | 1 | | | | | | | 25 | |
| 10 | 40 | 25 | 10 | | | | | | | 5 | 10 |
| 11 | 40 | 27 | 1 | 10 | | | | 2 | 3 | 15 | |
| 12 | 40 | 25 | | 10 | | | | 2 | 3 | 10 | 5 |
| 13 | 40 | 25 | 3 | | | | | | | 12 | 10 |
| 14 | 32 | 26 | | 8 | | | | 1 | 3 | 10 | 10 |
| 15 | 85.5 | 8 | | | 5 | | 1.5 | | | | |
| 16 | 80 | 10 | | | 10 | | | | | | |
| 17 | 80 | 8 | | | 10 | | 2 | | | | |
| 18 | 78 | 8 | | | 10 | | 4 | | | | |
| 19 | 40 | 25 | | | 10 | | | | | 10 | 10 |
| 20 | 40 | 25 | | | 5 | | | | | 10 | 10 |
| 21 | 40 | 25 | | | 3 | | | | | 10 | 10 |
| 22 | 30 | 30 | | | 10 | | | | | 10 | 10 |
| 23 | 40 | 25 | | | | 5 | | | | 10 | 10 |
| 24 | 40 | 25 | | | | 10 | | | | 10 | 10 |
| 25 | 90 | 8 | | | | | 2 | | | | |
| 26 | 85.5 | 8 | | | | | 1.5 | | | 5 | |
| 27 | 85 | 5 | | | | | | | | 10 | |
| 28 | 50 | 24.1 | | | | | | | | 25.9 | |
| 29 | 45 | 21.7 | | | | | | | | 23.3 | 10 |
| 30 | 45 | 25 | | | | | | | | 10 | 10 |
| 31 | 45 | 21.7 | | | | | | | | 23.3 | |
| 32 | 40 | 25 | | | | | | | | 25 | |
| 33 | 40 | 30 | | | | | | | | 10 | 10 |
| 34 | 20 | 30 | | | | | | | | 20 | 10 |
| 35 | 15 | 35 | | | | | | | | 12 | 15 |
| 36 | | 40 | | | | | | | 3 | 15 | 20 |
| 37 | | 40 | | | | | | | 3 | 15 | 20 |
| 38 | | 40 | | | 10 | | | | 3 | 15 | 20 |
| Comparative Example 1 | PbO: 50, $B_2O_3$: 15, $SiO_2$: 15, $TiO_2$: 5, ZnO: 10, $Al_2O_3$: 5 (mass %) | | | | | | | | | | |
| Comparative Example 2 | $Bi_2O_3$: 50, $B_2O_3$: 20, $SiO_2$: 5, BaO: 15, ZnO: 10 (mass %) | | | | | | | | | | |

| Glass Sample No. | Glass Composition (mass %) | | | | | Softening Point (°C.) | Electrical Resistivity of Electrode Wiring | Ion Fraction |
|---|---|---|---|---|---|---|---|---|
| | $WO_3$ | $TeO_2$ | CuO | $MoO_3$ | $B_2O_3$ | | | |
| 1 | | | | | | — | ○ | 0.78 |
| 2 | 5 | | | | | 383 | ○ | 0.65 |
| 3 | | | | | | 395 | Δ | 0.48 |
| 4 | | | | | | 378 | Δ | 0.45 |
| 5 | | | | | | 428 | Δ | 0.42 |
| 6 | | | | | | 442 | ○ | 0.55 |
| 7 | | | | | | 413 | Δ | 0.40 |
| 8 | | | | | | 446 | ○ | 0.62 |
| 9 | | | | | | 456 | ⊙ | 0.73 |
| 10 | 10 | | | | | 457 | Δ | 0.36 |
| 11 | | 2 | | | | 437 | Δ | 0.33 |
| 12 | 5 | | | | | 434 | Δ | 0.39 |
| 13 | 10 | | | | | 452 | ○ | 0.56 |
| 14 | 10 | | | | | 460 | Δ | 0.36 |
| 15 | | | | | | — | ○ | 0.86 |
| 16 | | | | | | — | ○ | 0.74 |
| 17 | | | | | | — | ○ | 0.77 |
| 18 | | | | | | — | Δ | 0.72 |
| 19 | 5 | | | | | 455 | Δ | 0.39 |
| 20 | 10 | | | | | 451 | Δ | 0.46 |
| 21 | 12 | | | | | 455 | ○ | 0.55 |
| 22 | 10 | | | | | 514 | Δ | 0.34 |
| 23 | 10 | | | | | 465 | X | 0.36 |
| 24 | 5 | | | | | 460 | X | 0.35 |
| 25 | | | | | | — | ○ | 0.86 |
| 26 | | | | | | — | ○ | 0.82 |
| 27 | | | | | | — | ○ | 0.84 |

TABLE 1-continued

| | | | | | | | | |
|---|---|---|---|---|---|---|---|---|
| 28 | | | | | | 441 | ⊙ | 0.65 |
| 29 | | | | | | 415 | ⊙ | 0.65 |
| 30 | 10 | | | | | 443 | ⊙ | 0.60 |
| 31 | | 5 | 5 | | | 445 | ○ | 0.64 |
| 32 | | | 10 | | | 466 | Δ | 0.58 |
| 33 | 10 | | | | | 487 | ⊙ | 0.57 |
| 34 | 20 | | | | | 575 | ⊙ | 0.60 |
| 35 | 20 | | | | 3 | 588 | ⊙ | 0.57 |
| 36 | 20 | | | | 2 | 603 | ⊙ | 0.60 |
| 37 | | | | 20 | 2 | 560 | ⊙ | 0.56 |
| 38 | 10 | | | | 2 | 580 | ○ | 0.54 |
| Comparative Example 1 | PbO: 50, $B_2O_3$: 15, $SiO_2$: 15, $TiO_2$: 5, ZnO: 10, $Al_2O_3$: 5 (mass %) | | | | | 522 | X | — |
| Comparative Example 2 | $Bi_2O_3$: 50, $B_2O_3$: 20, $SiO_2$: 5, BaO: 15, ZnO: 10 (mass %) | | | | | 489 | X | — |

(Fabrication of Conductive Paste)

As metal particles to be contained in a conductive paste, alloy particles comprising 92 mass % of copper and 8 mass % of aluminum were prepared. The raw materials were mixed such that the resultant mixture had that composition and fused together. From the resultant alloy, spherical particles of 92Cu-8Al alloy were produced by water atomizing. The alloy particles obtained by water atomizing were classified using a sieve (aperture: 8 μm), and spherical metal particles having a particle size of less than 8 μm were prepared (i.e., particles having a particle size of greater than or equal to 8 μm were removed).

The spherical metal particles thus obtained were mixed with each of the conductive glass powder samples having the compositions shown in Table 1 such that the spherical metal particles represented 90% by volume and the conductive glass powder represented 10% by volume. Then, a binder resin and a solvent were added to the powder mix and the mixture was kneaded to form a conductive paste. Ethyl cellulose was used as the binder resin, and butyl carbitol acetate was used as the solvent.

(Formation of Electrode Wiring)

Each of the conductive pastes thus formed was applied to a polycrystalline silicon substrate, which is used for solar panels and the like, by screen printing. Then, each substrate was dried at 150° C. for several minutes and subjected to a heat treatment at 700° C. to 800° C. performed in the air for a period of from several seconds to several tens of minutes to form electrode wiring. Each fired film (each electrode wiring sample) was about 20 μm in thickness.

(Measurement of Characteristic Temperature of Conductive Glass)

The characteristic temperature of each conductive glass sample thus fabricated was measured in the following procedures. The measurement was performed in the ambient air at a temperature increase rate of 5° C./min utilizing a differential thermal analysis (DTA) device (a product of Sinku-Riko, Inc., Model: DT-1500) with a standard sample of α-alumina and a sample material being 1 g each.

Figure 12:
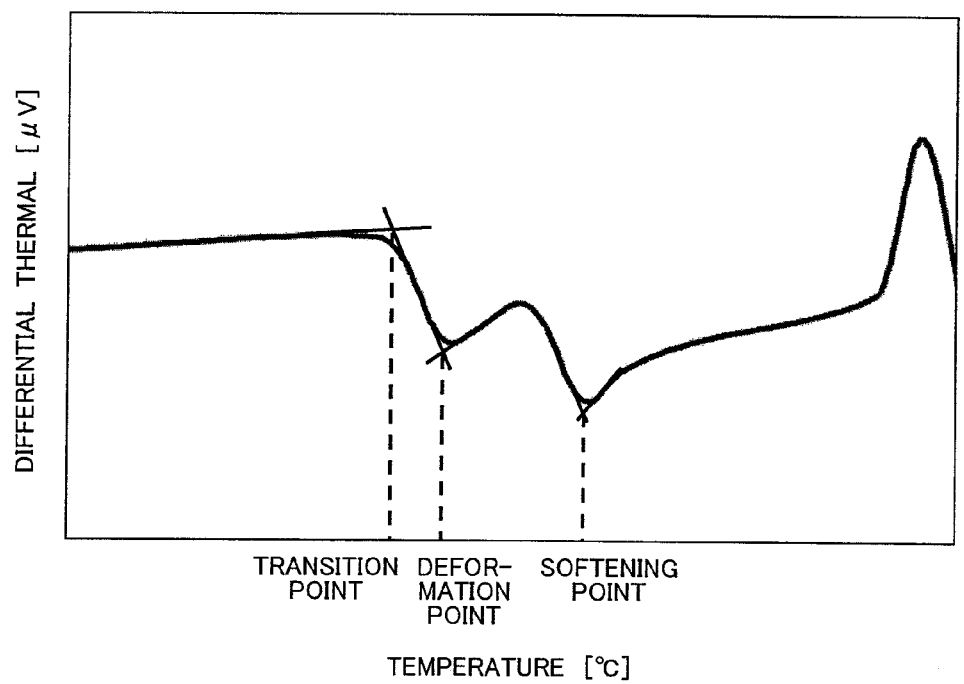
FIG. 12 is an exemplary DTA curve obtained by means of the DTA measurement of a glass composition.

FIG. 12 is an exemplary DTA curve obtained by means of the DTA measurement of a glass composition. In the DTA curve of FIG. 12, the onset temperature of the first endothermic peak (obtained by the tangent method) was defined as the transition point of the glass composition; the peak temperature of the first endothermic peak (obtained by the tangent method) was defined as the deformation point of the glass composition; and the peak temperature of the second endothermic peak (obtained by the tangent method) was defined as the softening point of the glass composition. The measurement results of the softening point are shown in Table 1. Also, the measurement results of the transition point and deformation point are shown in Table 5 below.

(Measurement of Electrical Resistivity of Electrode Wiring)

The electrical resistivity of each electrode wiring sample formed in the above-described procedures was measured by the conventional four-probe resistive method at room temperature. Samples having an electrical resistivity of less than $1 \times 10^{-4}$ Ω·cm were evaluated as "⊙" meaning "good"; those having an electrical resistivity of not less than $1 \times 10^{-4}$ Ω·cm and less than $1 \times 10^{-3}$ Ω·cm were evaluated as "○" meaning "passed"; those having an electrical resistivity of not less than $1 \times 10^{-3}$ Ω·cm and less than $1 \times 10^{-2}$ Ω·cm were evaluated as "Δ" meaning "failed"; and those having an electrical resistivity of more than or equal to $1 \times 10^{-2}$ Ω·cm were evaluated as "x" meaning "bad", since electrode wiring having such a high resistivity is unusable. The measurement results are shown in Table 1.

(Fraction Measurement of Ions in Conductive Glass)

In order to find out the oxidation number state of each transition metal contained in each conductive glass sample, each transition metal in the fabricated conductive glass was measured by redox titrimetry in accordance with JIS-G1221, JIS-G1220, JIS-G1218, JIS-H1353, and JIS-G1213. The total of the measured concentrations of pentavalent vanadium ($V^{5+}$), hexavalent tungsten ($W^{6+}$), hexavalent molybdenum ($Mo^{6+}$), trivalent iron ($Fe^{3+}$), and quadrivalent manganese ($Mn^{4+}$) was divided by the total of the concentrations of vanadium, tungsten, molybdenum, iron, and manganese in the sample to obtain the proportion of the atoms which have the largest oxidation number for each transition metal (hereinafter referred to as "ion fraction"). Herein, an ion fraction is expressed by the following equation (1'):

$$\text{Ion fraction} \equiv \frac{\{V^{5+}\} + \{W^{6+}\} + \{Mo^{6+}\} + \{Fe^{3+}\} + \{Mn^{4+}\}}{\{V\} + \{W\} + \{Mo\} + \{Fe\} + \{Mn\}}, \quad \text{Eq. (1')}$$

where braces { } indicate the measured concentration of the enclosed ion or atom (unit: mol/L).

(Examination)

Based on the results shown in Table 1, conductive glass samples used for electrode wiring samples having an electrical resistivity of "⊙" or "○" were examined. As a result, none of the electrode wiring samples showed any signs of oxidation of metal particles, and it was confirmed that each of them had excellent oxidation resistance.

Moreover, a relationship between the electrical resistivity of electrode wiring and the above-mentioned ion fraction was examined, and it was found that glass compositions used for electrode wiring samples exhibiting an excellent electrical resistivity ("⊙" or "○") satisfied the relationship expressed by the following equation (1):

$$\frac{\{V^{5+}\} + \{W^{6+}\} + \{Mo^{6+}\} + \{Fe^{3+}\} + \{Mn^{4+}\}}{\{V\} + \{W\} + \{Mo\} + \{Fe\} + \{Mn\}} > 0.5. \quad \text{Eq. (1)}$$

Herein, a preferred relationship is "ion fraction>0.55", and a more preferred relationship is "ion fraction>0.6".

In addition, an examination of a relationship between the electrical resistivity of electrode wiring and the above-mentioned ion fraction also revealed that the mass fractions of the constituents, in terms of oxides, of glass compositions used for electrode wiring samples exhibiting an excellent electrical resistivity ("⊙" or "○") satisfied the relationship expressed by the following equation (2):

$$2 \times \frac{[V_2O_5]}{[P_2O_5]} \geq ([Sb_2O_3] + [Fe_2O_3] + [MnO_2] + [Bi_2O_3]) \geq 0, \quad \text{Eq. (2)}$$

where brackets [ ] indicate the mass fraction of the enclosed oxide (unit: mass %).

Even within the range where the equation (2) above was satisfied, when conductive glass containing any of tellurium (Te), which is a heavy metal, lithium (Li), sodium (Na), and potassium (K), which are alkaline metal elements, was used, there were cases where the electrical resistivity of the electrode wiring increased. As a result of a close examination, it was found that a preferred tellurium content was less than or equal to 5% by mass, a preferred total content of sodium and potassium was less than or equal to 5% by mass, and a preferred lithium content was less than or equal to 2% by mass, in terms of oxides. It was also found that conductive glass samples containing a larger amount of barium (e.g., 15% or more by mass in terms of barium oxides) were chemically more stable.

In addition, as shown by the results of Glass Samples No. 36-38, tungsten-phosphorus-based conductive glass, molybdenum-phosphorus-based conductive glass, and tungsten-iron-phosphorus-based conductive glass, which did not contain vanadium, all exhibited an excellent electrical resistivity. This indicates that conductive glass having an oxidation resistance effect on metal particles is not limited to vanadium-phosphorus-based glass, but it may be tungsten-phosphorus-based glass, molybdenum-phosphorus-based glass, or tungsten-iron-phosphorus-based glass, which are electron-conductive.

Microstructures of each electrode wiring sample were observed utilizing a scanning electron microscope-energy dispersive X-ray spectroscopy (SEM-EDX) analyzer. FIG. 1 is a schematic illustration showing a typical SEM observation image of a microstructure of formed electrode wiring. As shown in FIG. 1, the electrode wiring 10 which exhibited excellent electrical resistivity properties had been fired into a dense structure with the surfaces of metal particles 11 uniformly wet with a glass phase 12.

The conductive glass of the present invention is characterized in that each transition metal contained is present in the state of having a plurality of oxidation numbers in the glass phase and that the proportion of the atoms of the transition metal which have the largest oxidation number is larger than that of the atoms of the transition metal which have the other oxidation numbers. For example, in the case of vanadium-phosphorus-based conductive glass, the proportion of $V^{5+}$ present in the glass phase is larger than that of $V^{4+}$, which imparts electron conductivity by electron hopping conduction to the glass and anticorrosion properties (oxidation resistance) to the metal particles.

On the other hand, in the case where the equation (1) above was not satisfied, it was observed that oxidation of the metal particles was in progress in the electrode wiring. This can be considered as follows. In a glass phase of electrode wiring, while the glass phase has electron conductivity even when the equation (1) is not satisfied, the number of positive holes which contribute to conductivity increases compared with the case where the equation (1) is satisfied. When the number of positive holes in the glass phase increases, the positive holes associate with electrons in the metal particles and the metal particles are ionized, which promotes oxidation. Also, the higher the firing temperature was, the more noticeably this phenomenon occurred. This can be attributed to the increased carrier mobility of the electrons and positive holes in the glass phase under elevated temperature.

Also, in each of the electrode wiring samples formed from Comparative Example 1 and Comparative Example 2, the metal particles of 92Cu-8Al alloy were oxidized, and the metal, the Pb component or the Bi component, in the glass phase was reduced and precipitated in the metallic state in the vicinity of the grain boundaries of the particles. As a result, the electrode wiring samples formed from Comparative Example 1 and Comparative Example 2 did not exhibit excellent electrical resistivity.

Embodiment 2

Preparation of Conductive Paste

As metal particles to be contained in a conductive paste, a pure aluminum powder having an average particle size of about 3 μm was prepared. The metal particles were mixed with a conductive glass powder of Glass Sample No. 9, which exhibited excellent results in Embodiment 1, such that the metal particles represented 99.5% by volume and the conductive glass powder represented 0.5% by volume. Then, a binder resin and a solvent were added to the powder mix and the mixture was kneaded to form a conductive paste. As in Embodiment 1, ethyl cellulose was used as the binder resin, and butyl carbitol acetate was used as the solvent. Conductive pastes formed from glass powders of Comparative Example 1 and Comparative Example 2 were also fabricated.

(Fabrication of Electrode Wiring and Measurement of Electrical Resistivity)

Electrode wiring was formed in the same procedures as those in Embodiment 1. This time, electrode wiring samples were fabricated under different firing temperature conditions. The electrical resistivity of each electrode wiring sample thus formed was measured by the conventional four-probe resistive method at room temperature.

(Examination and Results)

Figure 2:
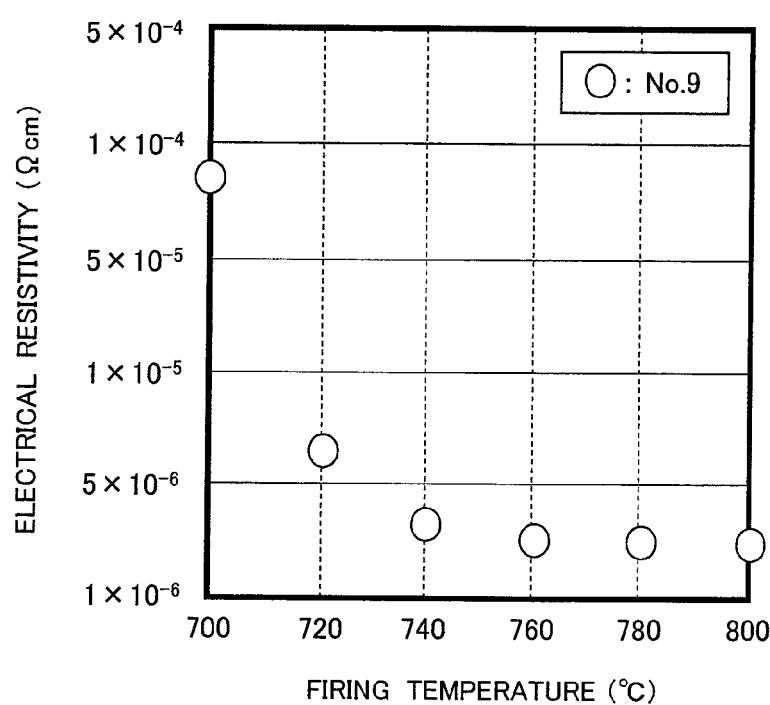
FIG. 2 is a graph showing a relationship between the electrical resistivity of electrode wiring formed from conductive glass of Glass Sample No. 9 and the firing temperature.

FIG. 2 is a graph showing a relationship between the electrical resistivity of electrode wiring formed from conductive glass of Glass Sample No. 9 and the firing temperature. As can be seen from FIG. 2, at each firing temperature, an electrical resistivity of less than $1 \times 10^{-4}$ Ω·cm was obtained, and at temperatures higher than or equal to 740° C., in particular, a remarkably low electrical resistivity of less than $5 \times 10^{-6}$ Ω·cm was obtained. Also, the results of X-ray diffraction (XRD) measurements and SEM-EDX analyses performed on the electrode wiring samples indicated that each electrode wiring sample had been sintered at each firing temperature into a dense structure like the one shown in FIG. 1, and there was no sign of precipitation of a crystal phase derived from vanadium or local segregation of vanadium.

On the other hand, in electrode wiring samples formed from Comparative Example 1 and Comparative Example 2, the metal particles of pure aluminum were oxidized, and metals such as the Pb component and the Bi component in the glass phase were reduced and precipitated in the metallic state in the vicinity of the grain boundaries of the particles. As a result, the electrode wiring samples formed from Comparative Example 1 and Comparative Example 2 did not exhibit excellent electrical resistivity.

As has been described above, according to the present invention, even in the case where pure aluminum, which is an easily-oxidizable base metal, is used as a material for metal particles to be contained in a conductive paste to be fired in an oxidizing atmosphere, oxidation of the metal particles can be prevented in forming electrode wiring, which permits the formation of electrode wiring having a low electrical resistivity. This means that in fabricating a conductive paste, there is no need to impose any particular limitation to the metal particle material to be mixed in the conductive paste, and that various metal particle materials can be used depending on the application of the electronic part.

Embodiment 3

Examination of Volume Fractions of Metal Particles and Conductive Glass in Electrode Wiring Next, the volume fractions of metal particles and a conductive glass in electrode wiring were examined. The same pure aluminum powder and conductive glass powder of Glass Sample No. 9 as those used in Embodiment 2 were compounded in volume fractions shown in Table 2. Then, the same binder resin and solvent as those in Embodiment 1 were added to the powder mix and the mixture was kneaded to form conductive paste samples (Sample No. A1-A9). Electrode wiring samples were formed from these conductive paste samples under the same conditions as those in Embodiment 1.

The adhesion strength of each electrode wiring sample was evaluated by a peel test, in which commercially available adhesive cellophane tape was attached to each electrode sample and then peeled off from it. The evaluation criteria were as follows: if almost all of the aluminum particles peeled off, the samples were evaluated as "x" meaning "bad"; if part of the aluminum particles peeled off and part of the electrode wiring broke, the samples were evaluated as "Δ" meaning "failed"; if the aluminum particles thinly adhered to the adhesive cellophane tape but the electrode wiring did not break, the samples were evaluated as "○" meaning "passed"; and if the aluminum particles did not peel off at all, the samples were evaluated as "⊙" meaning "good". The peel test results are shown in Table 2.

TABLE 2

| Sample No. | Aluminum Fraction (vol %) | Glass Fraction (vol %) | Peel Test Result |
|---|---|---|---|
| A1 | 99.9 | 0.1 | X |
| A2 | 99.7 | 0.3 | Δ |
| A3 | 99.5 | 0.5 | ○ |
| A4 | 99 | 1 | ○ |
| A5 | 97 | 3 | ○ |
| A6 | 95 | 5 | ○ |
| A7 | 92 | 8 | ⊙ |

TABLE 2-continued

| Sample No. | Aluminum Fraction (vol %) | Glass Fraction (vol %) | Peel Test Result |
|---|---|---|---|
| A8 | 90 | 10 | ⊙ |
| A9 | 88 | 12 | ⊙ |

As can be seen from Table 2, a preferred fraction of conductive glass is greater than or equal to 0.3% by volume (i.e., a preferred fraction of metal particles is less than or equal to 99.7% by volume). More preferably, a conductive glass fraction is greater than or equal to 0.5% by volume, and still more preferably, greater than or equal to 8% by volume.

Figure 3:
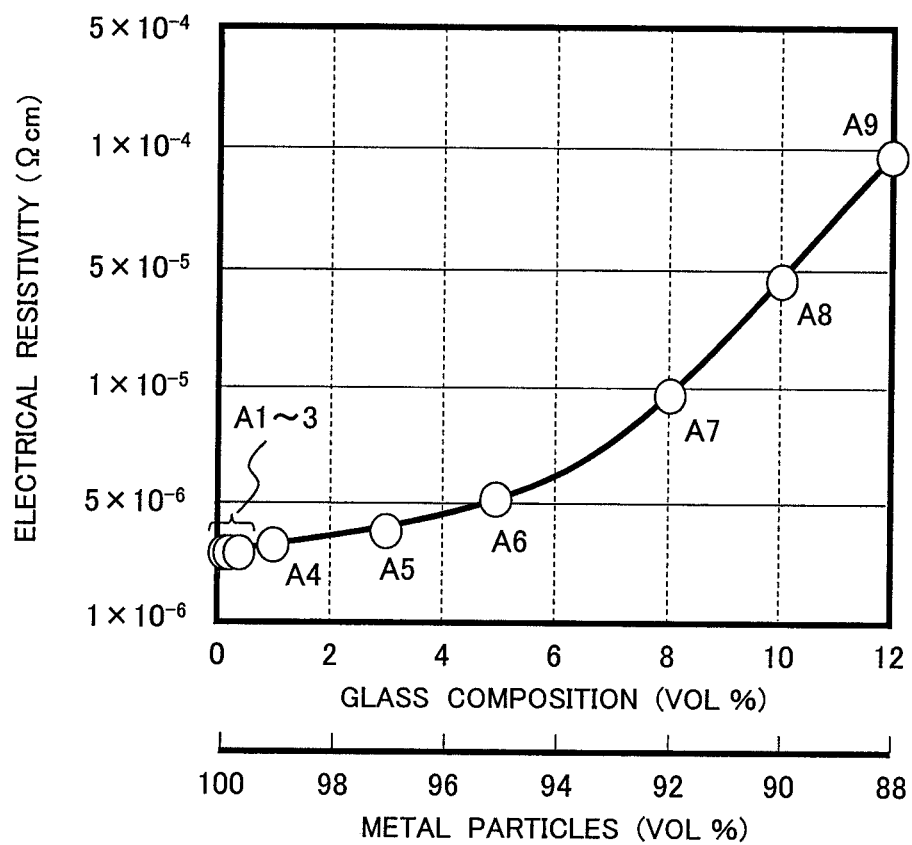
FIG. 3 is a graph showing a relationship between the electrical resistivity of electrode wiring and the volume fraction of conductive glass.

In addition, the electrical resistivity of each electrode wiring sample was measured in the same manner as in Embodiment 1. FIG. 3 is a graph showing a relationship between the electrical resistivity of electrode wiring and the volume fraction of conductive glass. As shown in FIG. 3, electrode wiring samples containing less than or equal to 12% by volume of conductive glass exhibited an excellent electrical resistivity. In other words, it was found that an excellent electrical resistivity (i.e., a low electrical resistivity) can be obtained if electrode wiring contains not less than 88% and not more than 99.7% by volume of metal particles and not less than 0.3% and not more than 12% by volume of a conductive glass phase.

Embodiment 4

Examination of Particle Size of Metal Particles in Electrode Wiring

Next, the particle size of metal particles contained in electrode wiring was examined. First, the same copper-aluminum alloy powder as the one used in Embodiment 1 (92Cu-8Al powder, particle size: less than 8 μm) was prepared. The powder was classified using a sieve (aperture: 1.5 μm) (i.e., particles having a particle size of greater than or equal to 1.5 μm were removed) to obtain spherical metal particles having a particle size of less than 1.5 μm (hereinafter referred to as "a first group of particles") and spherical metal particles having a particle size of not less than 1.5 μm and less than 8 μm (hereinafter referred to as "a second group of particles").

A particle size measurement was performed on each of the classified first and second groups of particles using a laser diffraction particle size distribution measuring instrument (a product of NIKKISO CO., LTD., model: MT3300, solvent refractive index: 1.333). The results showed that the first group of particles had an average particle size of about 1 μm with about 95% by volume thereof having a particle size in the range of not less than 0.5 μm and less than 1.5 μm, and that the second group of particles had an average particle size of about 5 μm with about 95% by volume thereof having a particle size in the range of not less than 1.5 μm and less than 8 μm.

The first and second groups of particles were compounded in mass fractions shown in Table 3 (unit: mass %) and, as in Embodiment 1, mixed with a conductive glass powder of Glass Sample No. 9 such that the metal particles represented 90% by volume and the conductive glass powder represented 10% by volume. Then, a binder resin and a solvent were added to the powder mix and the mixture was kneaded to form conductive paste samples (Sample No. B1-B5). Electrode wiring samples were formed from these conductive paste samples under the same conditions as those in Embodiment 1.

TABLE 3

| Sample No. | Compounding Ratio of Particles Having Different Particle Sizes (mass %) | |
|---|---|---|
| | First Group of Particles | Second Group of Particles |
| B1 | 0 | 100 |
| B2 | 25 | 75 |
| B3 | 50 | 50 |
| B4 | 75 | 25 |
| B5 | 100 | 0 |

(Examination and Results)

The results of X-ray diffraction (XRD) measurements and SEM-EDX analyses performed on the electrode wiring samples indicated that each electrode wiring sample had been sintered into a dense structure like the one shown in FIG. 1, and there was no sign of precipitation of a crystal phase derived from vanadium or local segregation of vanadium. Also, it was observed that the microstructures of electrode wiring samples B2-B4 were more closely packed than those of the other samples (Sample No. B1 and B5).

Figure 4:
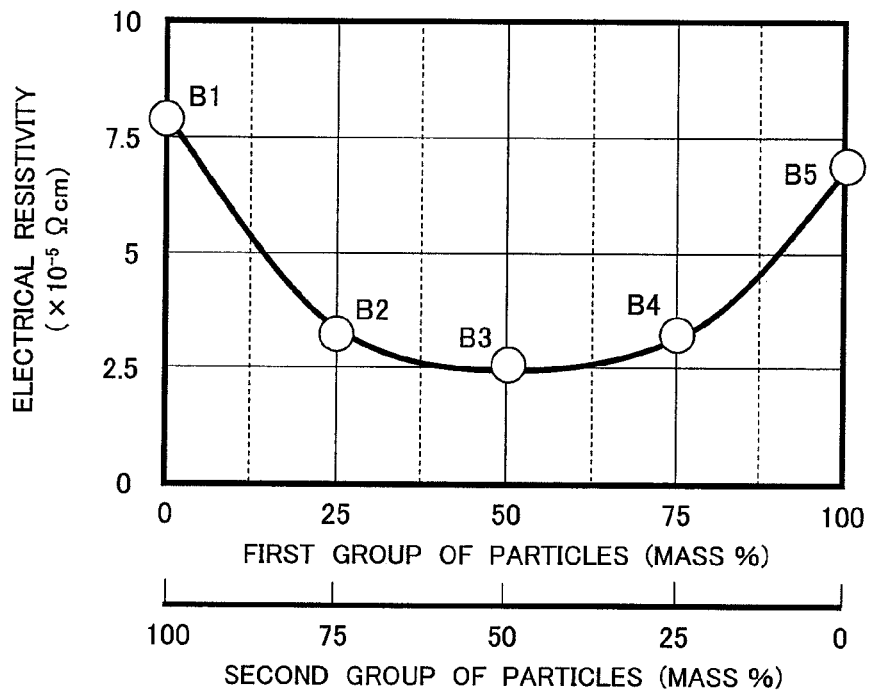
FIG. 4 is a graph showing a relationship between the compounding ratio of metal particles having different average particle sizes and the electrical resistivity of electrode wiring.

The resistivity of each electrode wiring sample was measured in the same manner as in Embodiment 1. FIG. 4 is a graph showing a relationship between the compounding ratio of metal particles having different average particle sizes and the electrical resistivity of electrode wiring. As can be seen from FIG. 4, at each compounding ratio, an excellent electrical resistivity of less than $1 \times 10^{-4}$ Ω·cm was obtained, and when the content of the first group of particles was within the range of 15 to 90 mass % (i.e., the content of the second group of particles was 85 to 10 mass %), in particular, a remarkably low electrical resistivity of less than or equal to $5 \times 10^{-5}$ Ω·cm was obtained. Also, it can be said that the content of the first group of particles within the range of 25 to 75 mass % (i.e., the content of the second group of particles within the range of 75 to 25 mass %) is more preferable, since an even lower electrical resistivity was obtained.

The present embodiment revealed that a conductive paste containing a combination of groups of metal particles having different average particle sizes and electrode wiring formed therefrom had lower electrical resistivities than those of a conductive paste containing a single group of particles and electrode wiring formed therefrom.

Embodiment 5

Examination of Shape of Metal Particles in Electrode Wiring

The shape of metal particles in electrode wiring was examined. First, a copper-aluminum alloy powder (92Cu-8Al powder, particle size: less than 8 μm) was prepared as in Embodiment 4 and then classified using a sieve (aperture: 1.5 μm) (i.e., particles having a particle size of greater than or equal to 1.5 μm were removed) to obtain spherical metal particles having a particle size of less than 1.5 μm ("a first group of particles"). Next, the first group of particles was divided into two subgroups, and one of the two subgroups was ball-milled to form plate-like metal particles using an organic solvent as a dispersion solvent. Then, in order to clean their surface and secure their thermal stability, the plate-like metal particles were annealed at 700° C. in a reducing atmosphere, and a third group of particles were thereby prepared.

The first and the third groups of particles were compounded in mass fractions shown in Table 4 (unit: mass %) and, as in Embodiment 1, mixed with a conductive glass powder of Glass Sample No. 9 such that the metal particles represented 90% by volume and the conductive glass powder represented 10% by volume. Then, a binder resin and a solvent were added to the powder mix and the mixture was kneaded to form conductive paste samples (Sample No. C1-C5). Electrode wiring samples were formed from these conductive paste samples under the same conditions as those in Embodiment 1.

TABLE 4

| Sample No. | Compounding Ratio of Particles Having Different Particle Sizes (mass %) | |
|---|---|---|
| | First Group of Particles | Third Group of Particles |
| C1 | 0 | 100 |
| C2 | 25 | 75 |
| C3 | 50 | 50 |
| C4 | 75 | 25 |
| C5 | 100 | 0 |

(Examination and Results)

The results of X-ray diffraction (XRD) measurements and SEM-EDX analyses performed on the electrode wiring samples indicated that each electrode wiring sample had been sintered into a dense structure like the one shown in FIG. 1, and there was no sign of precipitation of a crystal phase derived from vanadium or local segregation of vanadium. Also, it was observed that the microstructures of electrode wiring samples C1-C3 were more closely packed than those of the other samples (Sample No. C4 and C5).

Figure 5:
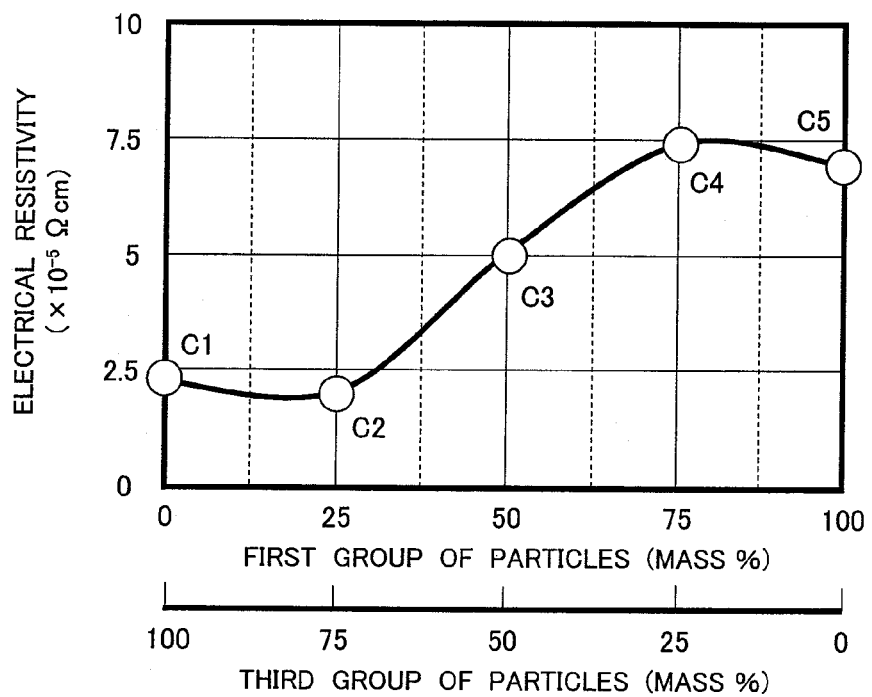
FIG. 5 is a graph showing a relationship between the compounding ratio of metal particles having different particle shapes and the electrical resistivity of electrode wiring.

The electrical resistivity of each electrode wiring sample was measured in the same manner as in Embodiment 1. FIG. 5 is a graph showing a relationship between the compounding ratio of metal particles having different particle shapes and the electrical resistivity of electrode wiring. As can be seen from FIG. 5, at each compounding ratio, an excellent electrical resistivity of less than $1 \times 10^{-4}$ Ω·cm was obtained, and when the content of the third group of particles was more than or equal to 50 mass % (i.e., the content of the first group of particles was less than or equal to 50 mass %), in particular, a remarkably low electrical resistivity of less than or equal to $5 \times 10^{-5}$ Ω·cm was obtained. Also, it can be said that the content of the third group of particles of more than or equal to 75 mass % (i.e., the content of the first group of particles of less than or equal to 25 mass %) is more preferable, since an even lower electrical resistivity was obtained.

The present embodiment revealed that the electrical resistivity of electrode wiring can be reduced by using a combination of spherical metal particles and plate-like metal particles or only plate-like particles as metal particles to be contained in a conductive paste and electrode wiring formed from the paste as compared to that of electrode wiring fabricated by using only spherical metal particles.

Embodiment 6

Examination of Application to Solar Panels

Figure 6A:
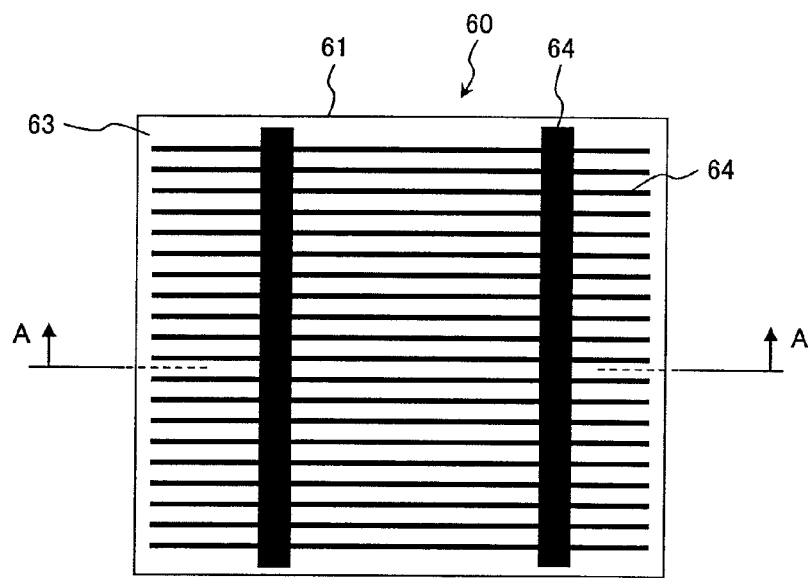
FIG. 6(a) is a schematic illustration showing a planar view of an exemplary light-receiving surface of a solar panel.
Figure 6B:
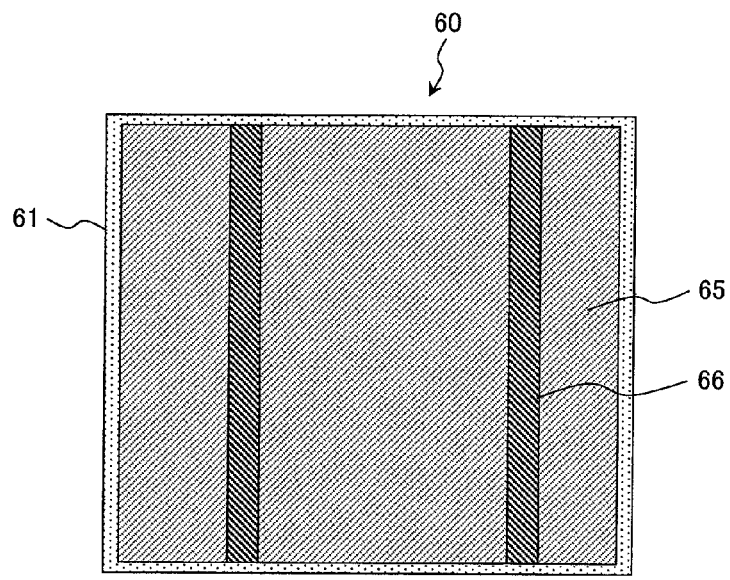
FIG. 6(b) is a schematic illustration showing a planar view of an exemplary back surface of a solar panel.

In the present embodiment, a solar panel application of the electronic part according to the present invention will be described. FIG. 6(a) is a schematic illustration showing a planar view of an exemplary light-receiving surface of a solar panel; FIG. 6(b) is a schematic illustration showing a planar view of an exemplary back surface of a solar panel; and FIG.

6(c) is a schematic illustration showing a cross-sectional view taken from line A-A in FIG. 6(a). The description will be presented hereinafter with reference to FIGS. 6(a) to 6(c).

Normally, a single crystalline silicon substrate or a polycrystalline silicon substrate is used for the semiconductor substrate 61 of a solar panel 60. This semiconductor substrate 61 contains boron or the like to serve as a p-type semiconductor. In order to damp reflections of sun light, concavities and convexities are formed on the light-receiving surface by etching or the like. Also on the side of the light-receiving surface, a diffusion layer 62, which is a n-type semiconductor, having a thickness on the order of submicrons is formed by doping phosphorus or the like, and a p-n junction is formed on the boundary with the p-type bulk portion. Moreover, an antireflection layer 63, having a thickness of about 100 nm, of silicon nitride or the like is formed on the light-receiving surface by vapor deposition or the like.

Next, the formation of light-receiving surface electrode wiring 64 on the light-receiving surface and collecting electrode wiring 65 and output electrode wiring 66 on the back side will be described. Normally, a conductive paste containing a glass powder and silver particles is used to form the light-receiving surface electrode wiring 64 and the output electrode wiring 66, and a conductive paste containing a glass powder and aluminum particles is used to form the collecting electrode wiring 65. Each of the pastes is applied to the surface of the semiconductor substrate 61 by screen printing or the like.

Each applied conductive paste is dried and then fired at about 500 to 800° C. in the air to form electrode wiring. At this point, on the light-receiving surface side, the glass composition contained in the light-receiving electrode wiring 64 reacts with the antireflection layer 63 to form an electrical connection between the light-receiving surface electrode wiring 64 and the diffusion layer 62. Meanwhile, on the back side, the aluminum component in the collecting electrode wiring 65 diffuses into the back side of the semiconductor substrate 61 to form an electrode component diffusion layer 67 in the surface region of the back side. By this formation of the electrode component diffusion layer 67, an ohmic contact can be obtained between the semiconductor substrate 61 and the collecting electrode wiring 65 and the output electrode wiring 66.

In a solar panel, aluminum particles have been conventionally used as a main conductive material for collecting electrode wiring. Unfortunately, however, the surface regions of aluminum particles are oxidized in the firing process in the air, which tends to increase the electrical resistance, as described above. Also, in the case of firing a conventional conductive paste containing a low-melting lead-based or bismuth-based glass composition and aluminum particles, the lead component or bismuth component in the glass is reduced and can segregate as metal particles of lead or bismuth among aluminum particles. In this case, the segregated particles inhibit the connection among aluminum particles. This and other factors tend to increase the electrical resistance of the collecting electrode wiring.

(Fabrication of Solar Panel)

Figure 6C:
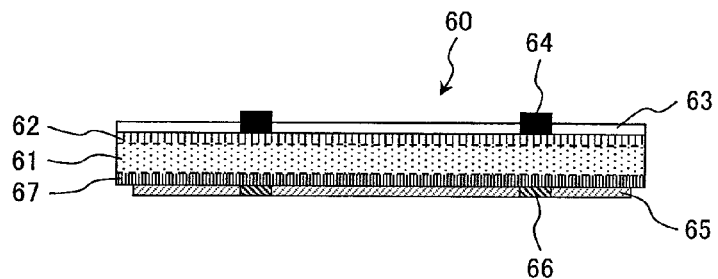
FIG. 6(c) is a schematic illustration showing a cross-sectional view taken from line A-A in FIG. 6(a).

A solar panel according to the present invention was fabricated. First, a semiconductor substrate 61 with a diffusion layer 62 and an antireflection layer 63 formed on the light-receiving surface side thereof was prepared. Next, a conductive paste of Sample No. A4 examined in Embodiment 3 was applied to the back side of the semiconductor substrate 61 by screen printing as shown in FIGS. 6(b) and 6(c). After being dried, the conductive paste was heated to 600° C. and held at the temperature for three minutes in the air utilizing an infrared rapid heating furnace to form collecting electrode wiring 65 on the back side of the semiconductor substrate 61.

Next, a conductive paste of Sample No. B3 examined in Embodiment 4 was applied to the light-receiving surface side and the back side, on which the collecting electrode wiring 65 had been formed as described above, of the semiconductor substrate 61 by screen printing as shown in FIGS. 6(a) to 6(c). After being dried, the conductive paste was heated to 750° C. and held at the temperature for one minute in the air utilizing an infrared rapid heating furnace to form light-receiving surface electrode wiring 64 and output electrode wiring 66.

In addition, another solar panel was separately fabricated in the same procedures as those described above except that the conductive pastes were heated to 800° C. and held at the temperature for three seconds in the air.

Figure 7:
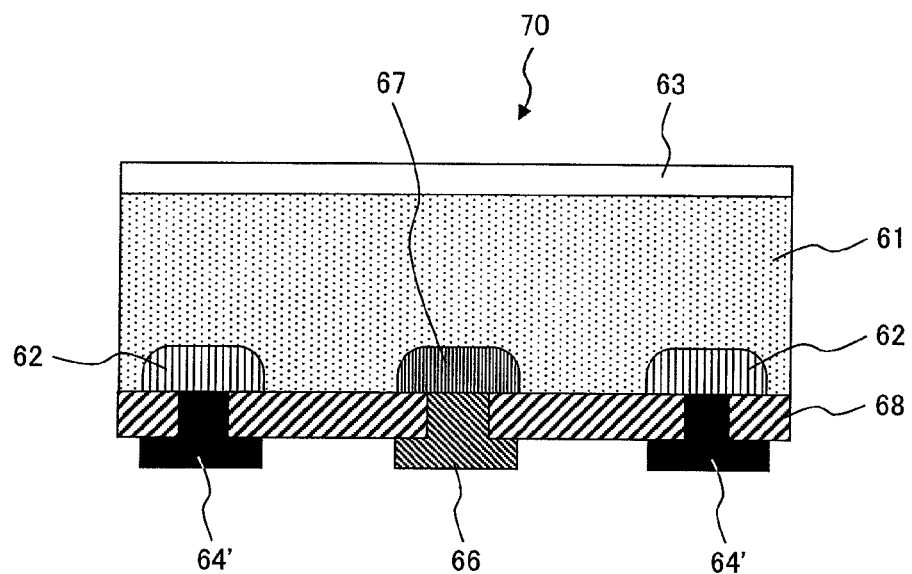
FIG. 7 is a schematic illustration showing a cross-sectional view of an exemplary back electrode type solar panel.

Moreover, a back electrode type (back contact type) solar panel with electrode wiring corresponding to the light-receiving surface electrode wiring 64 formed on the back side thereof was separately fabricated. FIG. 7 is a schematic illustration showing a cross-sectional view of an exemplary back electrode type solar panel. In the fabrication of the back electrode type solar panel, first, a semiconductor substrate 61 with diffusion layers 62 and 67 and a passivation film 68 formed on the back side thereof and an antireflection layer 63 formed on the light-receiving surface side thereof was prepared. Then, a conductive paste was applied to the back side and fired in the same manner as described above to form electrode wiring 64' (corresponding to light-receiving surface electrode wiring 64) and output electrode wiring 66, thereby fabricating the back electrode type solar panel 70.

(Tests and Evaluations of Solar Panels)

Various tests were conducted on the solar panels fabricated as described above and evaluations were made. In the panel of FIGS. 6(a) to 6(c), it was confirmed that the light receiving electrode wiring 64 and the semiconductor substrate 61 were electrically connected on the light-receiving surface side. It was also confirmed that an electrode component diffusion layer 67 had been formed and an ohmic contact had been obtained between the semiconductor substrate 61 and the collecting electrode wiring 65 and between the semiconductor substrate 61 and the output electrode wiring 66 on the back side. These were confirmed in the back electrode type solar panel as well.

Next, a high-temperature high-humidity test was conducted on each of the fabricated solar panels at a temperature of 85° C. and a relative humidity of 85% for 1000 hours. The results showed that there was no increase in the wiring resistance of electrode wiring or the contact resistance with the semiconductor substrate. Moreover, the power generation efficiency of each solar panel was tested and evaluated, and it was found that each panel had a power generation efficiency more than or equivalent to that of a conventional solar panel fabricated using a Pb-based glass phase and silver particles.

Accordingly, it can be said that the conductive paste according to the present invention has oxidation resistance that enables the conductive paste to withstand a high-temperature process performed in an oxidizing atmosphere and can be used in various solar panels by selecting appropriate heat treatment conditions depending on the structure. Also, the electronic part according to the present invention can be fabricated by utilizing inexpensive electrode wiring such as copper electrode wiring and aluminum electrode wiring as a substitute for conventional expensive silver electrode wiring, thus contributing to cost reduction. Moreover, since electrode wiring formed from the conductive paste according to the present invention contains none of the substances prohibited by the RoHS directive (e.g. Pb), it is environmentally friendly.

Embodiment 7

Examination of Warpage of Solar Panel

In the present embodiment, a relationship between the collecting electrode wiring 65 formed on the back side of a solar panel and the warpage of a semiconductor substrate 61 was examined. A pure aluminum powder having an average particle size of about 3 μm was used as metal particles to be contained in a conductive paste to form the collecting electrode wiring 65. Also, conductive glass samples whose electrical resistivities were evaluated as "◉" or "◯" in Embodiment 1 were used as a conductive glass powder to be contained in the conductive paste. The characteristic temperatures of the conductive glass samples are shown in Table 5. The characteristic temperatures of the conductive glass samples were measured in Embodiment 1.

TABLE 5

| Glass Sample No. | Characteristic Temperature (° C.) | | |
|---|---|---|---|
| | Transition Point | Deformation Point | Softening Point |
| 1 | 267 | 281 | — |
| 2 | 335 | 352 | 383 |
| 6 | 380 | 405 | 442 |
| 8 | 367 | 390 | 446 |
| 9 | 375 | 400 | 456 |
| 13 | 375 | 412 | 452 |
| 15 | 238 | 252 | — |
| 16 | 290 | 307 | — |
| 17 | 256 | 273 | — |
| 21 | 373 | 390 | 455 |
| 25 | 221 | 236 | — |
| 26 | 232 | 248 | — |
| 27 | 257 | 273 | — |
| 28 | 375 | 394 | 441 |
| 29 | 348 | 369 | 415 |
| 30 | 353 | 381 | 443 |
| 31 | 373 | 396 | 445 |
| 33 | 390 | 419 | 487 |
| 34 | 480 | 506 | 575 |
| 35 | 488 | 520 | 588 |
| 36 | 452 | 485 | 603 |
| 37 | 420 | 449 | 560 |
| 38 | 433 | 455 | 585 |

The conductive paste for the collecting electrode wiring 65 was fabricated by: mixing the metal particles and the conductive glass powder such that the metal particles represented 99.5% by volume and the conductive glass powder represented 0.5% by volume; adding a binder resin and a solvent to the powder mix; and kneading the resultant mixture. The binder resin and the solvent were the same as those used in Embodiment 1. Solar panels were fabricated in the same manner as in Embodiment 6.

The amount of warpage of the semiconductor substrate 61 was measured for each solar panel. The amount of warpage of the semiconductor substrate 61 was evaluated by measuring the height from a horizontal plane on which the solar panel 60 was positioned to the highest portion of the semiconductor substrate 61. Herein, the dimensions of the semiconductor substrate 61 were 150 mm×150 mm×160 μm. In addition, the power generation efficiency of each of the fabricated solar panels was tested and evaluated.

(Examination and Results)

Figure 8:
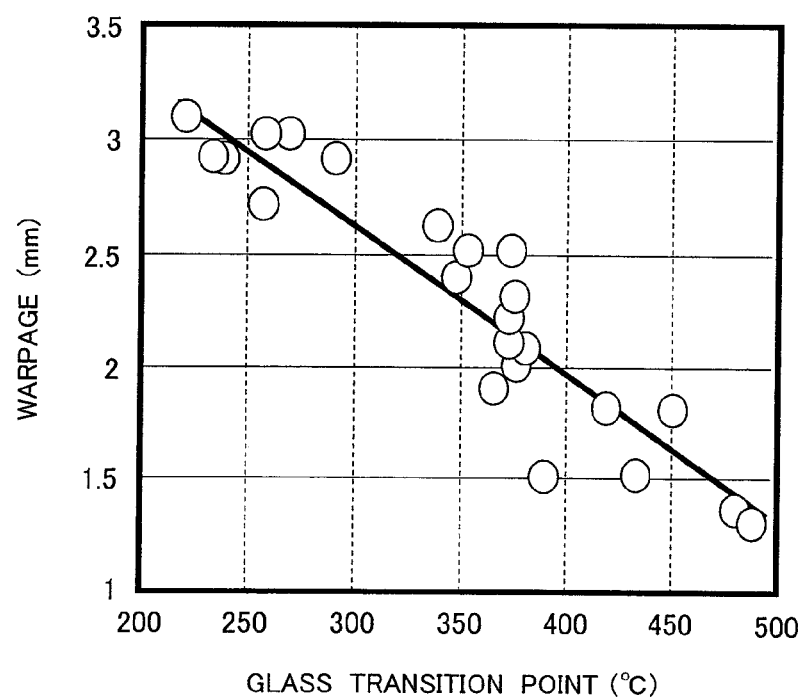
FIG. 8 is a graph showing a relationship between the glass transition point of conductive glass and the amount of warpage of a semiconductor substrate.

FIG. 8 is a graph showing a relationship between the glass transition point of conductive glass and the amount of warpage of a semiconductor substrate. As shown in FIG. 8, it was found that as the transition point of conductive glass increases, the amount of warpage of the semiconductor substrate 61 decreased. Generally, in a solar panel, the acceptable amount of warpage is said to be about 2 mm. Taking account of the results shown in FIG. 8, it can be said that a preferred transition point of conductive glass used in a conductive paste for collecting electrode wiring is higher than or equal to 400° C.

In addition, although not shown in Table 5 or FIG. 8, when conductive glass having a transition point of over 520° C. was used, the adhesion between the collecting electrode wiring and the semiconductor substrate was not good, and they detached from each other. Accordingly, a preferred transition point of conductive glass used in a conductive paste for collecting electrode wiring is not less than 400° C. and not more than 520° C.

Meanwhile, as for the power generation efficiency of a solar panel, the smaller the amount of warpage of the semiconductor substrate was, the higher the power generation efficiency was. In other words, it can be said that a preferred transition point of conductive glass used in a conductive paste for collecting electrode wiring is not less than 400° C. and not more than 520° C. also in terms of power generation efficiency.

Embodiment 8

Examination of Application to Plasma Display Panels

Figure 9:
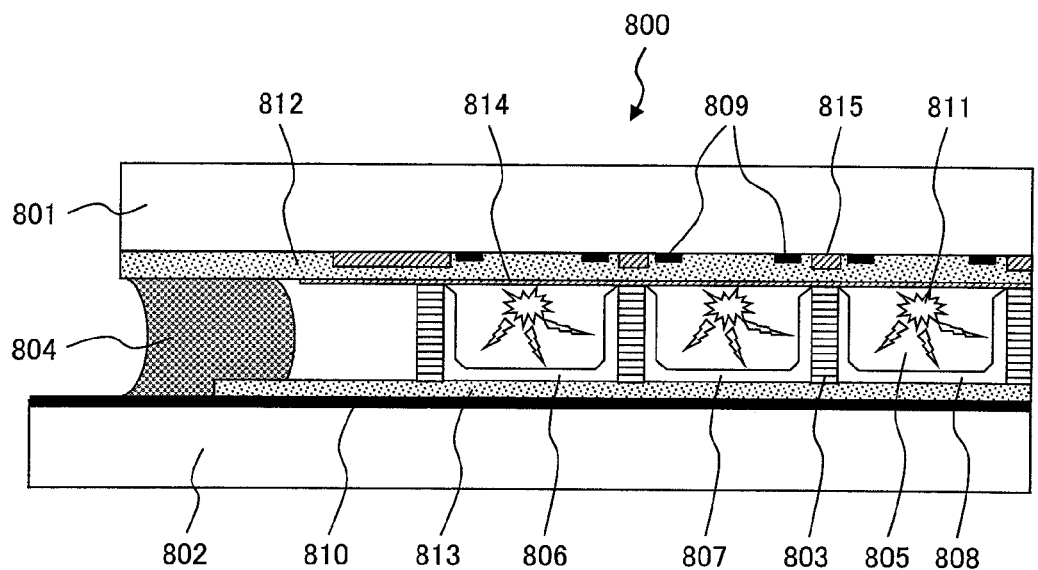
FIG. 9 is a schematic illustration showing a cross-sectional view of an exemplary plasma display panel.

In the present embodiment, a plasma display panel (PDP) application of the electronic part according to the present invention will be described. FIG. 9 is a schematic illustration showing a cross-sectional view of an exemplary plasma display panel. The description will be presented hereinafter with reference to FIG. 9.

First, a common plasma display panel will be described. A plasma display panel 800 is provided with a front plate 801 and a back plate 802 facing each other at a gap of 100 to 150 μm therebetween. The gap between the substrates (the front plate 801 and the back plate 802) is maintained by partition walls 803. The periphery of the front plate 801 and the back plate 802 is airtightly sealed by a sealing material 804, and the interior of the panel is filled with a noble gas.

Display electrodes 809 are formed on the front plate 801; a dielectric layer 812 is formed on the display electrodes 809; and a protection layer 814 (e.g., a deposited film of MgO (magnesium oxide)) to protect the display electrodes 809 and the like from an electrical discharge is formed on the dielectric layer 812. In addition, address electrodes 810 are formed on the back plate 802; a dielectric layer 813 is formed on the address electrodes 810; and the partition walls 803 to constitute cells 805 are provided on the dielectric layer 813. These partition walls 803 are composed of structures, normally stripe structures or box structures, fabricated by sintering a material containing at least a glass composition and a filler at 500 to 600° C. Also, the address electrodes 810 on the back plate 802 are formed such that they are orthogonal to the display electrodes 809 on the front plate 801.

Each of the microscopic spaces (the cells 805) separated by the partition walls 803 is filled with a phosphor. The phosphor in each cell 805 is formed by filling a phosphor paste into the cell and firing the phosphor paste at 450 to 500° C. Three color cells, which are a cell filled with a red phosphor 806, a cell filled with a green phosphor 807, and a cell filled with a blue phosphor 808, constitute one pixel. Each pixel emits variously colored light depending on the signals received by the display electrodes 809 and the address electrodes 810.

The sealing material 804 is applied to the periphery of either the front plate 801 or the back plate 802 in advance by means of the dispenser method, the printing method, or the like. The applied sealing material 804 may be calcined at the same time as the firing of the phosphors 806 to 808. By calcining the applied sealing material, blow holes can be significantly reduced, and thus a reliable (i.e. hermetic) glass sealing portion can be obtained.

The front plate 801 and the back plate 802 are sealed by accurately positioning and disposing the separately fabricated front plate 801 and the back plate 802 such that they face each other and heating them to 420 to 500° C. During this heating process, the gas inside each of the cells 805 is discharged and the noble gas is filled into the cell instead, which completes a plasma display panel as an electronic part. While the sealing material 804 can come into direct contact with the display electrodes 809 and/or the address electrodes 810 during the calcination process of the sealing material and/or the glass sealing process, it is vital that the electrode wiring materials and the sealing material be composed such that they do not chemically react with each other.

In order to make the cells 805 of the plasma display panel illuminate (emit light), voltage is applied between the display electrodes 809 and the address electrodes 810 of the cells 805 to be illuminated for causing an address discharge, which excites the noble gas into the plasma state and accumulates wall charges in the cells 805. Then, a certain voltage is applied to pairs of display electrodes, which cause a display discharge only in the cells with accumulated wall charges to generate ultraviolet light 811. By utilizing this ultraviolet light 811, the phosphors 806 to 808 illuminate to display image information.

Herein, as the display electrodes 809 and the address electrodes 810, electrode wiring formed from a silver thick film has been conventionally used taking account of its excellent electrical properties and oxidation resistance during the fabrication process. While the display electrodes 809 and the address electrodes 810 can be formed by the sputtering method, the printing method is advantageously used for manufacturing cost reduction. Also, the dielectric layers 812 and 813 are normally formed by the printing method. The display electrodes 809, the address electrodes 810, and dielectric layers 812 and 813 are commonly fired at temperatures ranging from 450 to 620° C. in an oxidizing atmosphere.

As described before, there are problems associated with the use of electrode wiring formed from a silver thick film in that silver is susceptible to a migration phenomenon and is expensive. In order to solve these problems, it is preferred that electrode wiring formed from a silver thick film be switched to electrode wiring formed from a copper thick film. However, before switching to electrode wiring formed from a copper thick film, some conditions need to be met: that the copper is not oxidized during the firing process performed in an oxidizing atmosphere, so that the resistivity of the electrode wiring is not increased; that the electrode wiring does not chemically react with the dielectric layers; and that no gaps (blow holes) occur in the vicinity of the formed electrode wiring, so that the voltage endurance is not reduced; etc.

(Fabrication of Plasma Display Panel)

A plasma display panel according to the present invention was fabricated. First, the above-mentioned conductive paste B5 examined in Embodiment 4 was applied to the entire surface of a front plate 801 and a back plate 802 by screen printing and dried at 150° C. in the air. Next, excess portions of the applied films were removed by photolithography, and electrode wiring was patterned. Then, the patterned electrode wiring was fired at 600° C. in the air for 30 minutes to form display electrodes 809 on the front plate 801 and address electrodes 810 on the back plate 802.

Next, a black matrix 815 and dielectric layers 812 and 813 were applied to the plates and fired at 610° C. in the air for 30 minutes. The front plate 801 and the back plate 802 thus fabricated were disposed such that they face each other, and the periphery thereof was glass-sealed to fabricate a plasma display panel having a structure shown in FIG. 9.

(Evaluation of Plasma Display Panel)

No change in color due to oxidation during the firing process was observed in the electrode wiring (the display electrodes 809 and the address electrodes 810) formed from the conductive paste in accordance with the present invention. Also, no occurrence of gaps was observed at the interface between the display electrodes 809 and the dielectric layer 812 or the interface between the address electrodes 810 and the dielectric layer 813. Accordingly, the plasma display panel thus fabricated was visually in good condition.

Next, an illumination experiment was conducted on the fabricated plasma display panel. The electrical resistivities of the display electrodes 809 and the address electrodes 810 did not increase. Also, the voltage endurance did not decrease when the panel was illuminated. Moreover, no migration phenomenon occurred as it would have done with electrode wiring formed from a silver thick film, and no other problems were observed. In conclusion, it was confirmed that the conductive paste of the present invention was applicable to electrode wiring of a plasma display panel. In other words, according to the present invention, since it can serve as a substitute for electrode wiring formed from an expensive silver thick film, the conductive paste of the invention can greatly contribute to cost reduction.

Embodiment 9

Examination of Application to Multilayer Wiring Boards

Figure 10:
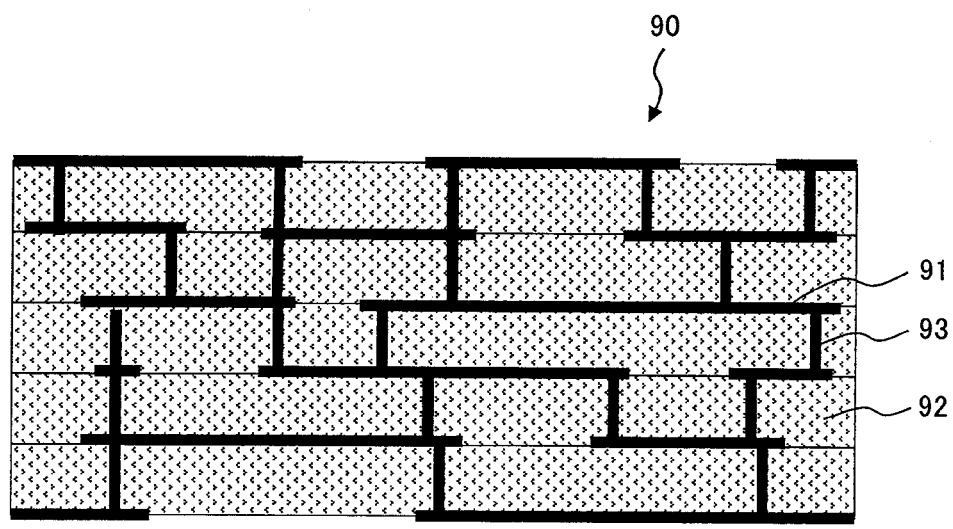
FIG. 10 is a schematic illustration showing a cross-sectional view of an exemplary structure of a multilayer wiring board (5-layered) of LTCC (Low Temperature Co-fired Ceramics) prior to firing.

In the present embodiment, a multilayer wiring board application of the electronic part according to the present invention will be described. FIG. 10 is a schematic illustration showing a cross-sectional view of an exemplary structure of a multilayer wiring board (5-layered) of LTCC (Low Temperature Co-fired Ceramics) prior to firing. As shown in FIG. 10, a multilayer wiring board 90 is a wiring board with wiring (a wiring conductive paste 91) formed three-dimensionally. The description will be presented hereinafter with reference to FIG. 10.

A multilayer wiring board is normally fabricated in the following procedures. First, green sheets 92 containing a glass powder, a ceramic powder, and a binder are prepared, and through holes 93 are bored in them at desired locations. A wiring conductive paste 91 is applied to each of the green sheets 92 having through holes 93 in any desired wiring pattern by the printing method and also filled into the through holes 93. The wiring conductive paste 91 is applied to the back side of each green sheet 92 by the printing method as needed. In the case where the wiring conductive paste 91 is applied to the back side of each green sheet 92, the conductive paste 91 applied to the front side of the sheet is dried beforehand.

The green sheets 92 having a predetermined wiring pattern are laminated and integrally fired to form an LTCC multilayer wiring board. Herein, the firing process is commonly performed at about 900° C. in the air. Also, as the wiring conductive paste, a conductive paste of silver is commonly used taking account of its excellent electrical properties and oxidation resistance during the fabrication process.

The use of a conductive paste of copper, which is advantageous in preventing a migration phenomenon and is inexpensive, has also been examined. However, because the firing process is performed in a nitrogen atmosphere to prevent oxidation of copper particles, the binder in the conductive paste 91 and the green sheets 92 cannot be removed (debinded) by firing very well, and as a result, it has been difficult to obtain a tight multilayer wiring board.

Also, in a conventional conductive paste of copper, the glass phase easily softens and flows at portions where the green sheets 92 are in contact with the conductive paste 91, and copper particles are oxidized, which leads to an increased electrical resistivity of the electrode wiring. Moreover, due to the chemical reaction with the glass phase, gaps can occur at the interface.

(Fabrication of Multilayer Wiring Board)

Figure 11:
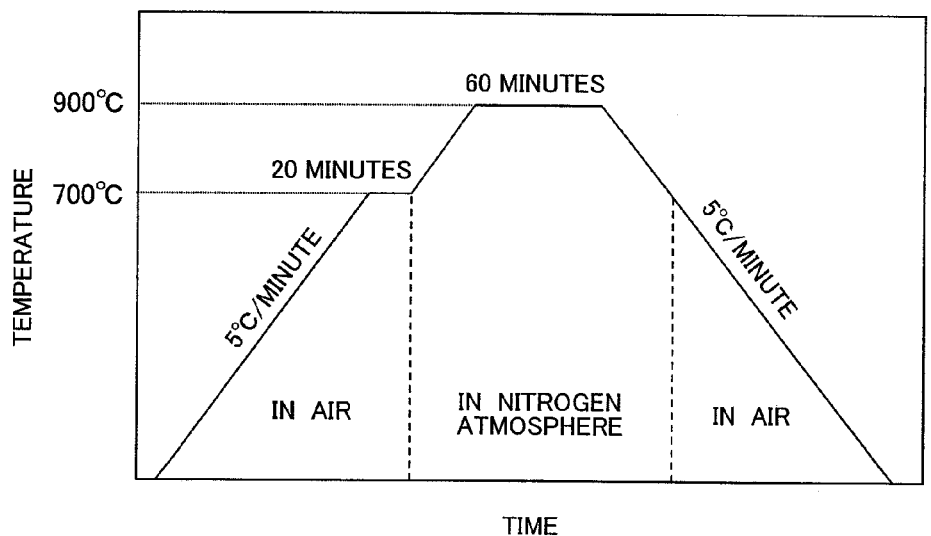
FIG. 11 is an exemplary temperature schedule for firing a multilayer wiring board in accordance with an embodiment of the present invention.

A multilayer wiring board according to the present invention was fabricated. First, a laminated body with multilayer wiring as shown in FIG. 10 was formed using the conductive paste B5 examined in Embodiment 4 as a wiring conductive paste 91 in the same procedures as those described above and fired according to the temperature schedule shown in FIG. 11. FIG. 11 is an exemplary temperature schedule for firing a multilayer wiring board in accordance with an embodiment of the present invention. As shown in FIG. 11, the firing process was performed in the air during the temperature rising process at temperatures ranging from room temperature up to 700° C.; in a nitrogen atmosphere at temperatures ranging from 700 to 900° C. (including a holding period of 60 minutes); and again in the air during the temperature falling process at temperatures ranging from 700° C. down to room temperature. Herein, the temperature schedule is not to be considered limited to the one shown in FIG. 11.

(Evaluation of Multilayer Wiring Board)

The electrical resistivity of the electrode wiring of the fabricated multilayer wiring board was measured and a value as designed was obtained. This indicates that the metal particles in the wiring conductive paste were not oxidized. Next, the cross section of the fabricated multilayer wiring board was observed, and it was found that the fabricated multilayer wiring board had been fired into a structure that was packed densely enough. This was considered to be because debinding was almost perfectly completed in the temperature rising process. Also, it was confirmed that no gaps occurred in the vicinity of the interface between the glass phase and the electrode wiring due to the chemical reaction therebetween. In conclusion, it was confirmed that the conductive paste of the present invention was applicable to electrode wiring of a multilayer wiring board. In other words, according to the present invention, since it can serve as a substitute for electrode wiring formed from an expensive silver thick film, the conductive paste of the invention can greatly contribute to cost reduction.

Embodiment 10

Examination of Conductive Paste Formed from Silver Particles

In the present embodiment, an example of a conductive paste fabricated using a pure silver powder as metal particles to be contained in the conductive paste being applied to a solar panel as a paste to form light-receiving surface electrode wiring in the same manner as in Embodiment 6 will be described. A pure silver powder having an average particle size of 1 μm was prepared as metal particles to be contained in a conductive paste, and, as in Embodiment 1, mixed with a conductive glass powder of Glass Sample No. 9 such that the metal particles represented 90% by volume and the conductive glass powder represented 10% by volume. Then, a binder resin and a solvent were added to the powder mix, and the mixture was kneaded to form a conductive paste. A solar panel was fabricated using the thus fabricated conductive paste under the same conditions as those in Embodiment 6.

(Examination and Results)

As in Embodiment 6, various tests were conducted on the solar panel fabricated as described above and evaluations were made. It was confirmed that light receiving electrode wiring 64 and the semiconductor substrate 61 were electrically connected on the light-receiving surface side of the solar panel. It was also confirmed that an electrode component diffusion layer 67 had been formed and an ohmic contact had been obtained between the semiconductor substrate 61 and collecting electrode wiring 65 and between the semiconductor substrate 61 and output electrode wiring 66 on the back side of the solar panel.

Next, a high-temperature high-humidity test was conducted on the fabricated solar panel at a temperature of 85° C. and a relative humidity of 85% for 1000 hours. The results showed that there was no increase in the wiring resistance of electrode wiring or the contact resistance with the semiconductor substrate. Moreover, the power generation efficiency of the fabricated solar panel was tested and evaluated, and it was found that the panel had a power generation efficiency equivalent to that of a conventional solar panel fabricated using a Pb-based glass phase and silver particles.

The present embodiment revealed that the conductive paste of the present invention was useful and applicable to a solar panel even in the conventional case of fabricating electrode wiring using silver particles as metal particles to be contained in a conductive paste and electrode wiring formed from the paste. Moreover, since it contains none of the substances prohibited by the RoHS directive (e.g. Pb), the conductive paste of the present invention can contribute to the protection of the environment.

The invention claimed is:

1. An electronic part equipped with electrode wiring, the electrode wiring comprising:
    a conductive glass phase containing transition metals and phosphorus;
    metal particles selected from the group consisting of copper, aluminum, a copper based alloy, and an aluminum based alloy; and
    none of the substances prohibited by the RoHS directive, wherein:
    each of the transition metals contained in the conductive glass phase is present in the state of having a plurality of oxidation numbers; and
    the proportion of the atoms that have the largest oxidation number for each of the transition metals satisfies a relationship expressed by the following equation (1):

$$0.86 \geq \frac{\{V^{5+}\} + \{W^{6+}\} + \{Mo^{6+}\} + \{Fe^{3+}\} + \{Mn^{4+}\}}{\{V\} + \{W\} + \{Mo\} + \{Fe\} + \{Mn\}} > 0.5. \quad \text{Eq. (1)}$$

2. The electronic part according to claim 1, wherein:
    the transition metals include at least vanadium; and the mass fractions of the constituents in terms of oxides satisfy a relationship expressed by the following equation (2):

$$2 \times \frac{[V_2O_5]}{[P_2O_5]} \geq ([Sb_2O_3] + [Fe_2O_3] + [MnO_2] + [Bi_2O_3]) \geq 0. \quad \text{Eq. (2)}$$

3. The electronic part according to claim 1, wherein the conductive glass phase contains 0 to 5 percent by mass of $TeO_2$ and 0 to 3 percent by mass of $MnO_2$.

4. The electronic part according to claim 3, wherein the metal particles represent not less than 90.0% and not more than 99.7% by volume, and the conductive glass phase represents not less than 0.3% and not more than 10.0% by volume, based on the total volume of the electrode wiring.

5. The electronic part according to claim 3, wherein the metal particles consist of a first group of particles about 95% by volume of which having a particle size in the range of not less than 0.5 and less than or equal to 0.86 μm and less than 1.5 μm and a second group of particles about 95% by volume of which having a particle size in the range of not less than 1.5 μm and less than 8 μm.

6. The electronic part according to claim 3, wherein the metal particles include spherical particles and plate-like particles.

7. The electronic part according to claim 3, wherein the metal particles in the electrode wiring have been sintered together.

8. A conductive paste comprising:
conductive glass particles containing transition metals and phosphorus;
metal particles selected from the group consisting of copper, aluminum, a copper based alloy, and an aluminum based alloy;
a binder resin;
a solvent; and
none of the substances prohibited by the RoHS directive, wherein:
each of the transition metals contained in the conductive glass particles is present in the state of having a plurality of oxidation numbers; and
the proportion of the atoms that have the largest oxidation number for each of the transition metals satisfies a relationship expressed by the following equation (1):

$$0.86 \geq \frac{\{V^{5+}\} + \{W^{6+}\} + \{Mo^{6+}\} + \{Fe^{3+}\} + \{Mn^{4+}\}}{\{V\} + \{W\} + \{Mo\} + \{Fe\} + \{Mn\}} > 0.5. \quad \text{Eq. (1)}$$

9. The conductive paste according to claim 8 wherein:
the transition metals include at least vanadium; and
the mass fractions of the constituents in terms of oxides satisfy a relationship expressed by the following equation (2):

$$2 \times \frac{[V_2O_5]}{[P_2O_5]} \geq ([Sb_2O_3] + [Fe_2O_3] + [MnO_2] + [Bi_2O_3]) \geq 0. \quad \text{Eq. (2)}$$

10. The conductive paste according to claim 8, wherein the conductive glass phase contains 0 to 5 percent by mass of $TeO_2$ and 0 to 3 percent by mass of $MnO_2$.

11. The conductive paste according to claim 10, wherein the conductive glass particles contain barium.

12. The conductive paste according to claim 10, wherein the metal particles consist of a first group of particles about 95% by volume of which having a particle size in the range of not less than 0.5 and less than or equal to 0.86 μm and less than 1.5 μm and a second group of particles about 95% by volume of which having a particle size in the range of not less than 1.5 μm and less than 8 μm.

13. The conductive paste according to claim 10, wherein the metal particles include spherical particles and plate-like particles.

14. The electronic part according to claim 3, wherein the electronic part is a solar panel, a plasma display panel, or a ceramic mounting substrate.

15. The electronic part according to claim 14, wherein the electronic part is a solar panel, and the glass transition point of the glass phase is not lower than 400° C. and not higher than 520° C.

16. The electronic part according to claim 1, wherein the conductive glass phase contains at least 65 percent by mass of $V_2O_5$ and 5 to 25 percent by mass of $P_2O_5$.

17. The electronic part according to claim 16, wherein the mass fraction of $[V_2O_5]/[P_2O_5]$ is 6 or more.

18. The electronic part according to claim 16, wherein the mass fraction of $[V_2O_5]/[P_2O_5]$ is 8 or more.

19. The conductive paste according to claim 8, wherein the conductive glass phase contains at least 65 percent by mass of $V_2O_5$ and 5 to 25 percent by mass of $P_2O_5$.

20. The conductive paste according to claim 19, wherein the mass fraction of $[V_2O_5]/[P_2O_5]$ is 6 or more.

21. The conductive paste according to claim 19, wherein the mass fraction of $[V_2O_5]/[P_2O_5]$ is 8 or more.

22. An electronic part equipped with electrode wiring, the electrode wiring comprising:
a conductive glass phase containing transition metals and phosphorus;
metal particles selected from the group consisting of copper, aluminum, a copper based alloy, and an aluminum based alloy; and
none of the substances prohibited by the RoHS directive, wherein:
each of the transition metals contained in the conductive glass phase is present in the state of having a plurality of oxidation numbers; and
the proportion of the atoms that have the largest oxidation number for each of the transition metals satisfies a relationship expressed by the following equation (1):

$$\frac{\{V^{5+}\} + \{W^{6+}\} + \{Mo^{6+}\} + \{Fe^{3+}\} + \{Mn^{4+}\}}{\{V\} + \{W\} + \{Mo\} + \{Fe\} + \{Mn\}} > 0.5; \quad \text{Eq. (1)}$$

the conductive glass phase contains 0 to 5 percent by mass of $TeO_2$ and 0 to 3 percent by mass of $MnO_2$; and
the metal particles consist of a first group of particles about 95% by volume of which having a particle size in the range of not less than 0.5 and less than or equal to 0.86 μm and less than 1.5 μm and a second group of particles about 95% by volume of which having a particle size in the range of not less than 1.5 μm and less than 8 μm.

23. A conductive paste comprising:
conductive glass particles containing transition metals and phosphorus;

metal particles selected from the group consisting of copper, aluminum, a copper based alloy, and an aluminum based alloy;
a binder resin;
a solvent; and
none of the substances prohibited by the RoHS directive,
wherein:
each of the transition metals contained in the conductive glass particles is present in the state of having a plurality of oxidation numbers; and
the proportion of the atoms that have the largest oxidation number for each of the transition metals satisfies a relationship expressed by the following equation (1):

$$\{V^{5+}\}+\{W^{6+}\}+\{Mo^{6+}\}+\{Fe^{3+}\}+\{Mn^{4+}\}/\{V\}+\{W\}+\{Mo\}+\{Fe\}+\{Mn\}>0.5 \quad \text{Eq. (1);}$$

the conductive glass phase contains 0 to 5 percent by mass of $TeO_2$ and 0 to 3 percent by mass of $MnO_2$; and
the metal particles consist of a first group of particles about 95% by volume of which having a particle size in the range of not less than 0.5 and less than or equal to 0.86 μm and less than 1.5 μm and a second group of particles about 95% by volume of which having a particle size in the range of not less than 1.5 μm and less than 8 μm.

* * * * *